(12) United States Patent
Wellman et al.

(10) Patent No.: US 6,212,449 B1
(45) Date of Patent: Apr. 3, 2001

(54) DIAGNOSING MALFUNCTIONS IN MATERIALS HANDLING VEHICLES

(75) Inventors: Timothy A. Wellman, Coldwater; James W. Gaskell, Troy; Donald T. Meiring, Osgood, all of OH (US)

(73) Assignee: Crown Equipment Corporation, New Bremen, OH (US)

( * ) Notice: Subject to any disclaimer, the term of this patent is extended or adjusted under 35 U.S.C. 154(b) by 0 days.

(21) Appl. No.: 09/161,823

(22) Filed: Sep. 28, 1998

Related U.S. Application Data

(60) Provisional application No. 60/060,487, filed on Sep. 30, 1997.

(51) Int. Cl.[7] ............................. B66F 9/24; G01R 31/00
(52) U.S. Cl. .................................................. 701/29; 701/35
(58) Field of Search ............................ 701/29, 30, 32, 701/33, 34, 35; 340/438, 439

(56) References Cited

U.S. PATENT DOCUMENTS

| | | | |
|---|---|---|---|
| 5,491,631 | * | 2/1996 | Shirane et al. ........................ 701/35 |
| 5,528,496 | * | 6/1996 | Brauer et al. ......................... 701/29 |
| 5,539,869 | * | 7/1996 | Spoto et al. ......................... 395/154 |
| 5,541,840 | * | 7/1996 | Gurne et al. .......................... 701/29 |
| 5,579,227 | | 11/1996 | Simmons, Jr. et al. ............... 701/29 |

FOREIGN PATENT DOCUMENTS

| | | |
|---|---|---|
| 0 416 171 A2 | 3/1991 | (EP) . |
| 0 468 805 A2 | 1/1992 | (EP) . |

OTHER PUBLICATIONS

Raymond, EASi Reach Service Manual, Jan. 15, 1995, pp. 47–49 menu description; p. 73 trouble shooting a problem: Code 2A; and, pp. 53–55 total available trouble codes.

* cited by examiner

Primary Examiner—Tan Nguyen
(74) Attorney, Agent, or Firm—King & Schickli PLLC

(57) ABSTRACT

A diagnosis system for materials handling vehicles leads service personnel step-by-step through diagnosis and repair of faults within the vehicle. Faults are assigned corresponding event codes so that when a fault is detected, its corresponding event code is displayed. The event codes uniquely identify systems of the vehicle in which faults have occurred by having the event codes for a given vehicle system all start with the same number. Thus, the technician knows from the event code what system needs to be diagnosed/repaired and what tools and probable parts will be needed. The event code is used to access diagnosis information identifying the portion of the vehicle wherein the malfunction has occurred, the components which caused the malfunction and, preferably, provides a pictogram of that portion of the vehicle. The technician advances to the malfunctioning portion of the vehicle where another pictorial depiction of the components of that portion of the vehicle assists in locating the components. All components are marked within the vehicle by identifiers which are consistently used throughout the diagnostic information, pictorial representations and service manuals. The diagnostic information tells the technician what to do to diagnose the components with the diagnosis being preformed using the electronic control system of the vehicle to monitor inputs to and outputs from the electronic control system and to apply limited duration full power test signals to components to be tested. The diagnostic information is configured so that testing is done from the end of control paths back to the controller.

22 Claims, 15 Drawing Sheets

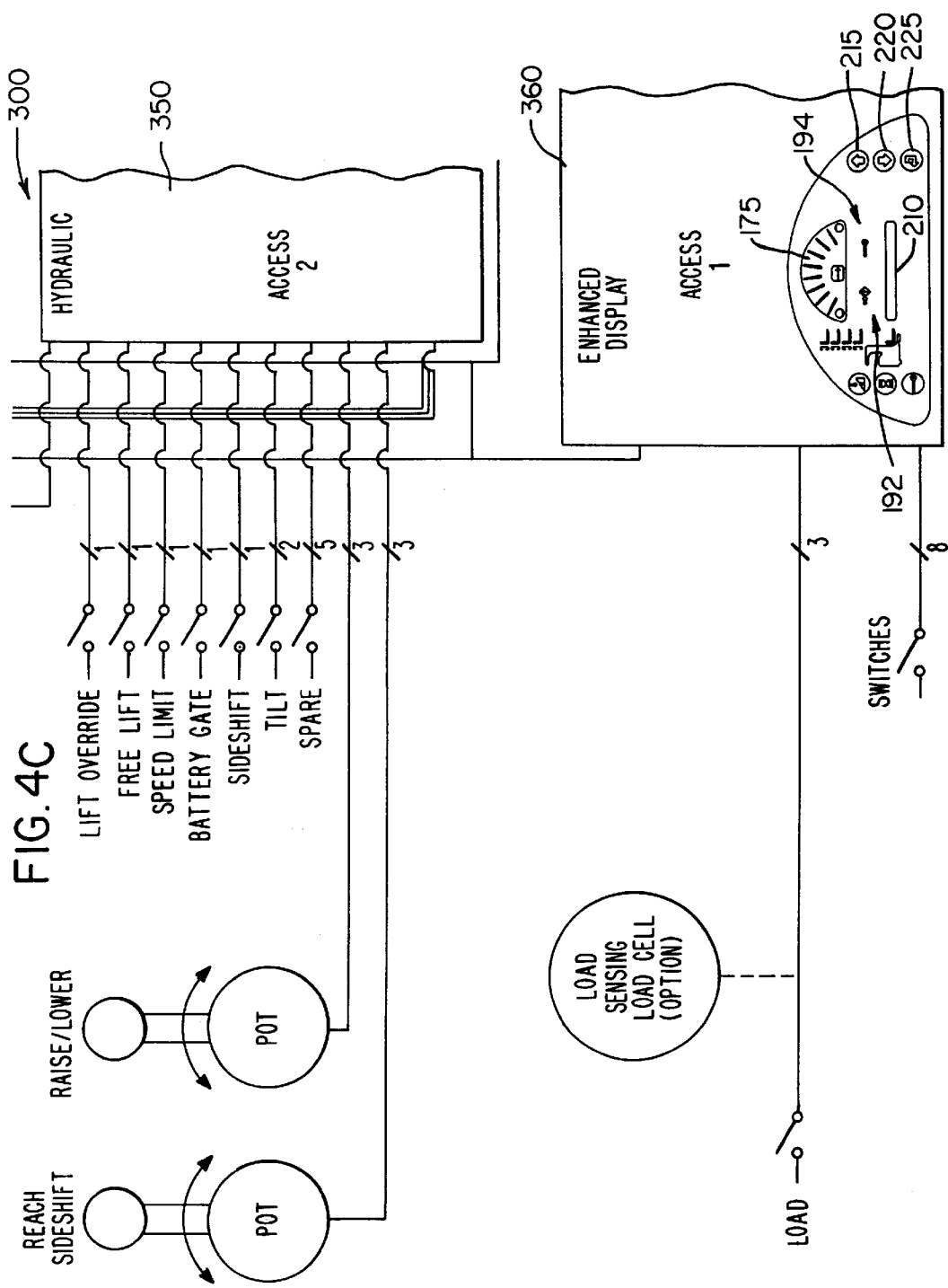

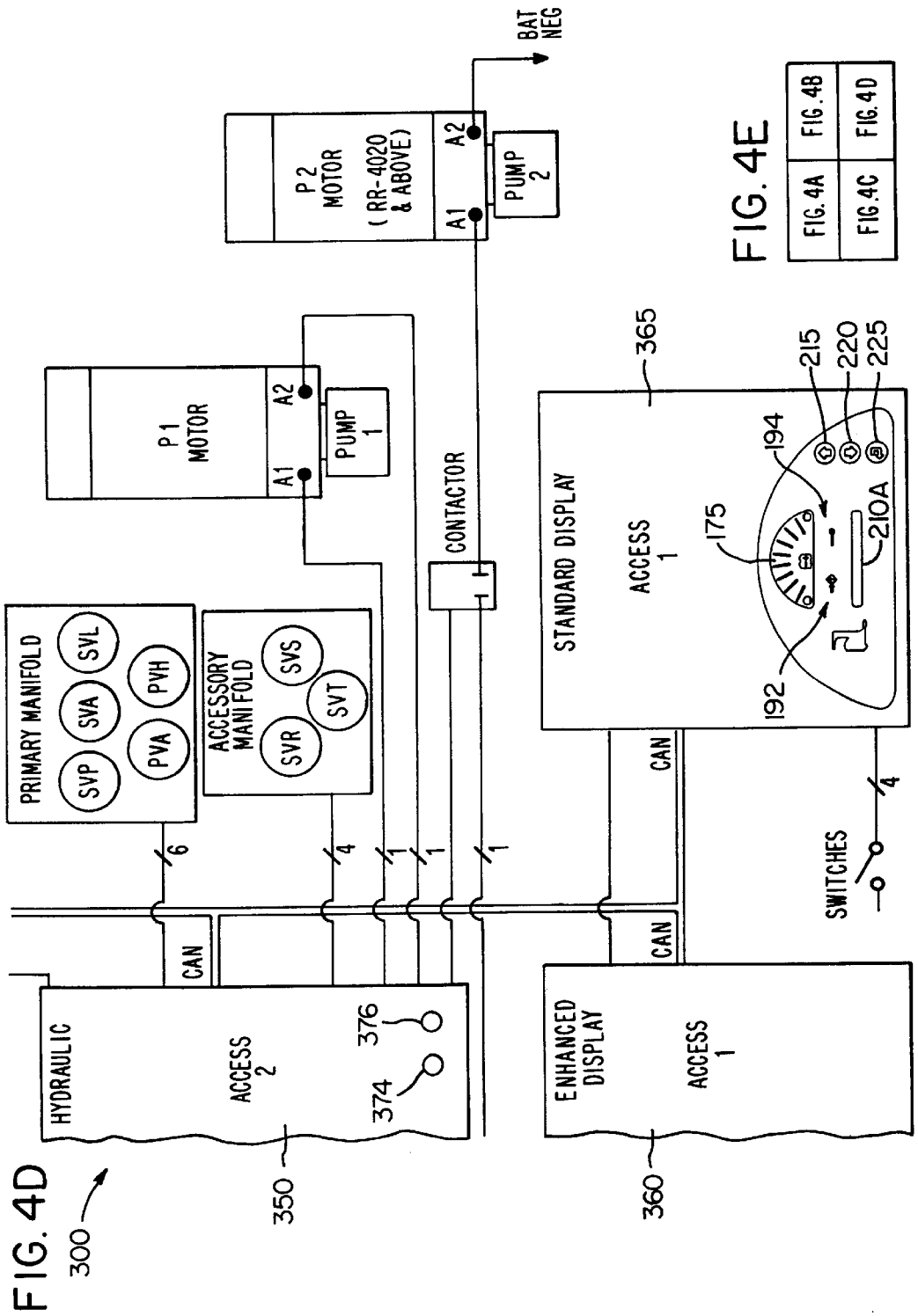

FIG.12

| STATUS CODE 245 | POT 2 (RAISE/LOWER) ABOVE ELECTRICAL LIMIT |
|---|---|

STEP 1: TURN KEY ON WHILE PRESSING THE ⊕ BUTTON.

SELECT POT2 (A2.4) ON DISPLAY MENU.

MOVE CONTROL HANDLE TO CONFIRM THE FOLLOWING READINGS.

IF: APPROXIMATELY 5 VOLTS. OPEN IN CIRCUIT BETWEEN POTENTIOMETER AND CA405-16 OR CA405-8 ON ACCESS 2.

OKAY, REPLACE POTENTIOMETER.

IF: APPROXIMATELY 2.5 VOLTS RAISE/LOWER HANDLE IS IN CENTER POSITION. CORRECT READING

IF: APPROXIMATELY 1.2 VOLTS RAISE/LOWER HANDLE IS IN FULL UP POSITION. CORRECT READIN

IF: APPROXIMATELY 3.8 VOLTS RAISE/LOWER HANDLE IS IN FULL LOWER POSITION. CORRECT READING

CORRECT READINGS CONFIRMED, INTERMITTENT CONNECTION LIKELY IN POTENTIOMETER CIRCUIT

THEN CHECK CONNECTIONS AND POTENTIOMETER

NOTE: ADJUST AND CALIBRATE THE POTENTIOMETER AFTER REPAIR.

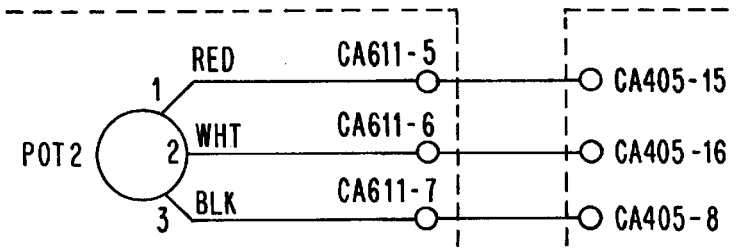

DIAGNOSING MALFUNCTIONS IN MATERIALS HANDLING VEHICLES

CROSS-REFERENCE TO RELATED APPLICATIONS

This application claims the benefit of U.S. Provisional Application Number 60/060,487, filed Sep. 30, 1997, which is incorporated herein by reference.

BACKGROUND OF THE INVENTION

The present invention relates in general to materials handling vehicles and, more particularly, to diagnosing and repairing such vehicles. While the present invention is generally applicable to materials handling vehicles, it will be described herein with reference to a rider reach fork lift truck for which it is particularly applicable and for which it is initially being utilized.

Materials handling vehicle repairs and service have conventionally been handled by trained personnel who are familiar with vehicles in need of diagnosis and repair. Control systems in these vehicles may generate an event code prior to being shut down to prevent possible damage to the vehicle due to a fault. Trained repair personnel were then faced with a dead vehicle with no information regarding the fault or, at best, were provided with an event code which identified the general area of the vehicle wherein a fault had occurred. Armed with this knowledge of the vehicle, and possibly the general direction provided by conventional event codes, the repair personnel would make reference to a detailed service manual to repair the faults.

While some repair personnel are very highly skilled and are able to quickly diagnose and repair faults in material handling vehicles under these circumstances, many other less skilled and less experienced repair persons are not. Repair persons of all skill levels can become extremely frustrated when faced with little, if any, clue as to a potential fault and a vast amount of general information about the vehicle which contains a solution to the fault but no way to effectively identify that solution. What has been experienced in the field in response to such frustration is resort to what may be referred to as "swaptronics", i.e., switching out components until a fault component, if any, is finally replaced to return the vehicle to service.

When swaptronics is employed, particularly in modern materials handling vehicles which include one or more computers or "black boxes", all too commonly a computer, probably one of the more expensive system components, is first replaced to be sure that it is not the cause of the fault since historically it was the most difficult to diagnose. If not the problem, additional components also end up being replaced resulting in large quantities of fault free components being replaced, possibly under warranty, with resultant costs and lost time both for the service person and the down time of the vehicle. In addition to the high relative cost of computer components, replacement of a computer is often a more difficult task than replacement of components driven by the computer which components have proven much more likely to be the cause of a fault than the computer.

Accordingly, there is a need for an improved arrangement for diagnosing and repairing faults which occur in materials handling vehicles. Such an improved diagnostic arrangement should make diagnosis and repair less dependent on the experience and skill level of a repair person by leading the repair person step-by-step through a diagnostics procedure to accurately identify the cause of a fault and enable the repair person to make a repair without replacement of properly functioning components. Preferably, such an improved diagnostic arrangement would follow a set procedure regardless of the location of faults which need to be corrected with the procedure not only leading the repair person to faulty components but clearly indicating the identity and location of those components on the vehicle through directions, maps and component identification labeling. In addition, the directions, maps and component identification labels should be provided to the service person as needed in the diagnostic process, i.e., information is provided to the service person on-time, rather than being presented as a mass of information which can overwhelm, frustrate and delay diagnosis and repair.

SUMMARY OF THE INVENTION

This need is met by the invention of the present application wherein a diagnosis system leads service personnel step-by-step through diagnosis and repair of faults which might occur in a materials handling vehicle. Possible faults within a vehicle are assigned to status or event codes which correspond one-to-one with the faults. Accordingly, when a fault is detected, its corresponding event code is generated and displayed to the operator of the vehicle as well as being stored in a history of logged events.

The event codes uniquely identify systems of the vehicle in which faults have occurred by having the event codes for a given vehicle system all start with the same number, e.g., 2XX codes indicate faults in the hydraulic system of the vehicle, 3XX codes indicate faults in the traction/braking system of the vehicle. Thus, from the event code alone the operator knows what system will need to be diagnosed/repaired, what tools and probable parts will be needed. The event code is then used to access diagnosis information which more specifically indicates the portion of the vehicle wherein the malfunction has occurred, the components which caused the fault and, preferably, provides a pictorial depiction of that portion of the vehicle to familiarize the technician with the locations and identifications of the components.

The technician then advances to the portion of the vehicle containing the fault and opens that portion of the vehicle to display another pictorial depiction of the components of that portion of the vehicle. All components are marked within the vehicle by identifiers which are consistently used throughout the diagnostic information, pictorial representations and service manuals to reduce confusion and facilitate location of components, diagnosis and repair of the components.

The diagnostic information then tells the technician what to do to diagnose the components to determine whether they are faulty and must be replaced or whether the components are functioning properly. The diagnosis is preformed using the electronic control system of the vehicle with the technician being able to configure the electronic control system of the vehicle to monitor inputs to and outputs from the electronic control system and to apply limited duration full power test signals to components to be tested. The electronic control system inputs and outputs can be monitored while operating the vehicle in a normal manner. But when limited time duration, full power tests are performed, normal vehicle operation is inhibited.

The diagnostic information is configured so that testing is done from the end of control paths back to the controller, i.e., controlled or signal generating components such as solenoids, relays, switches, potentiometers and the like are first tested to ensure that they are not faulty; next, circuitry interconnecting those components to the electronic control system is tested; and, finally if no faults are found in the peripheral elements of the system, modules of the electronic control system are suspect in causing faults.

It is, thus, an object of the present invention to provide an improved diagnostic system for a materials handling vehicle which guides service technicians step-by-step through the diagnostic procedures to remove frustration from the diagnostic process; to provide an improved diagnostic system for a materials handling vehicle wherein an electronic control system of the vehicle is used to monitor inputs to and outputs from the control system for diagnosing faults; to provide an improved diagnostic system for a materials handling vehicle wherein an electronic control system for the vehicle is used to provide limited time, full power test signals for components suspected of causing a malfunction within the vehicle; and, to provide an improved diagnostic system for a materials handling vehicle wherein service technicians are guided step-by-step through a diagnosis procedure which initially diagnoses and tests components which are at the end of control loops extending from an electronic control system, then circuitry interconnecting those components to the control system and, finally, if all else is without fault, examining the control system itself.

Other objects and advantages of the invention will be apparent from the following description, the accompanying drawings and the appended claims.

BRIEF DESCRIPTION OF THE DRAWINGS

FIGS. 4 and 4A–4D are electrical system block diagrams, with FIG. 4E showing how FIGS. 4A–4D fit together to form the electrical system block diagram of FIG. 4;

FIG. 12 is diagnostic information for an exemplary event or status code 245.

DETAILED DESCRIPTION OF THE INVENTION

Figure 1:
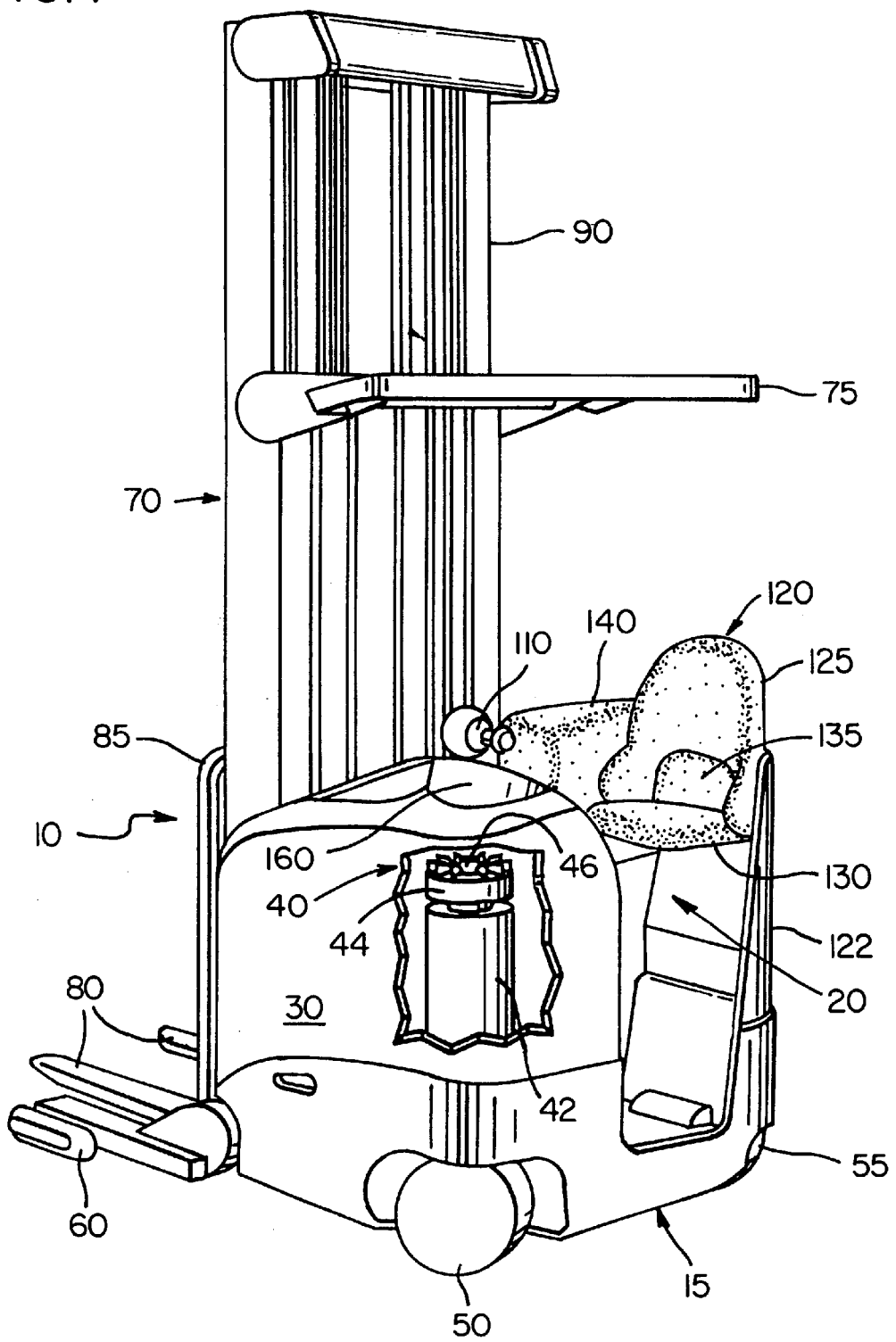
FIG. 1 is a perspective view showing a fork lift truck incorporating the present invention.
Figure 2:
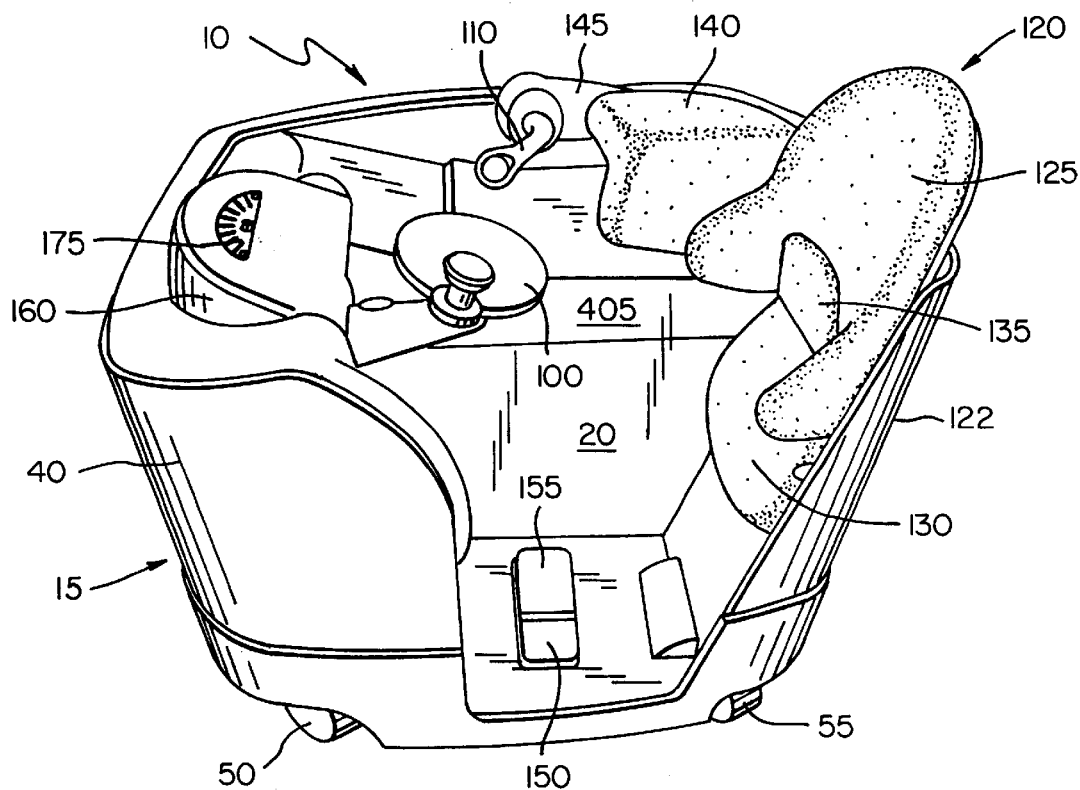
FIG. 2 is a perspective view of the power unit of the fork lift truck of FIG. 1.

FIGS. 1 and 2 show a rider reach truck 10 that includes a power unit 15 which includes an operator's compartment 20, a battery compartment 30, and a motor compartment 40. A battery in the battery compartment 30 supplies power to a traction motor 42 located in the motor compartment 40 and connected to a steerable wheel 50 located at the left rear corner of the power unit 15 and to hydraulic motors, see pump motors P1 and P2 of FIGS. 4 and 4D, which supply power to several different systems within the truck 10. Attached to the motor 42 is a brake 44 and a tachometer 46. A caster wheel 55 is mounted at the right rear corner of the power unit 15. A pair of outriggers 60 support the front end of the truck 10.

A mast assembly 70, mounted to the front of the truck 10, includes an overhead guard 75. A pair of forks 80 are carried on a fork carriage mechanism 85 which is carried on extendable mast elements 90. The fork carriage mechanism 85 may include a reach mechanism to allow the forks 80 to be extended forward of the mast assembly 70, a side shift mechanism to permit the forks 80 to be moved from side to side relative to the mast assembly 70, and a tilt mechanism to permit the forks 80 to be tilted relative to the horizontal.

As shown in FIG. 2, in the operator's compartment 20 are mounted a steering tiller 100 for controlling the direction of travel of the truck 10 and a control handle 110 for controlling the travel speed and direction of the truck 10 as well as fork height, fork extension, fork tilt and fork side-shift. Also located within the operator's compartment 20 is a seat assembly 120 which is attached to the right side 122 of the power unit 15, as shown. The seat assembly includes a back rest 125, a seat 130, and a shelf 135. The seat assembly is vertically adjustable for operator comfort. An armrest 140 is also supported on the seat assembly 120 for movement therewith. The control handle 110 is mounted on an arm 145 extending from the armrest 140.

On the floor of the operator's compartment 20 are two pedals 150 and 155. The left-hand pedal 150 operates an electric switch to control braking of the truck 10 while the right-hand pedal 155 operates a switch indicating the presence of the operator's foot thereon. An operator's console 160 provides the operator with information regarding the status of the battery voltage and may provide additional information regarding and the fork height and the weight of the load on the forks 80.

Figure 3:
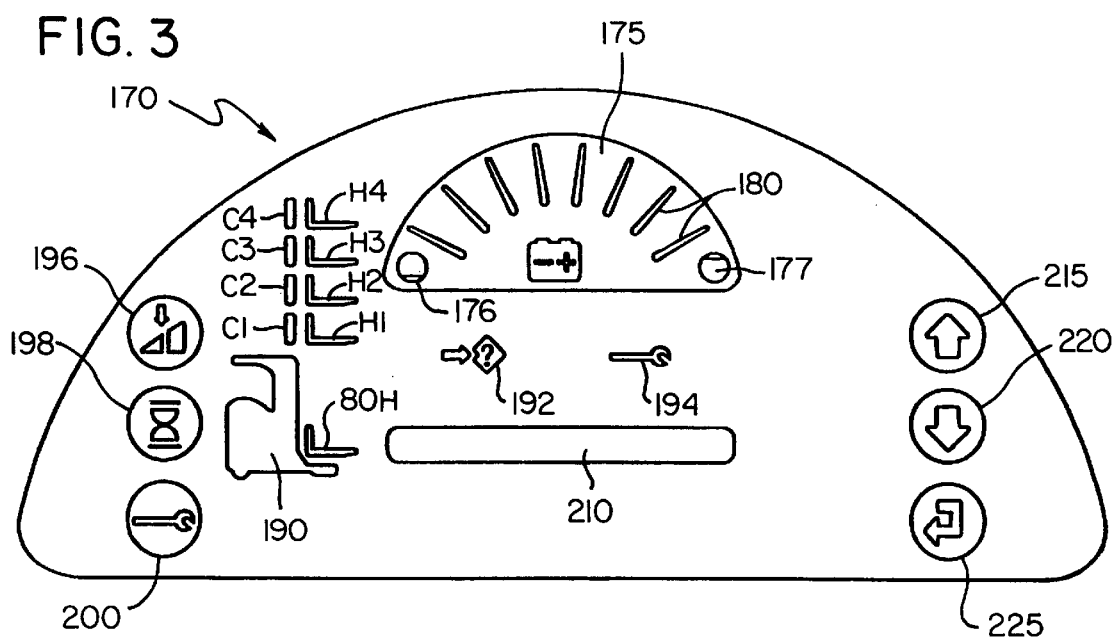
FIG. 3 illustrates a display panel on the fork lift truck of FIG. 1.

FIG. 3 is a view of a display panel 170 on the electric powered lift truck showing various indicators for use by the operator. On the display panel is a battery voltage level indicator 175 (a type of fuel gauge). A symbol 176 represents a discharged battery while a symbol 177 represents a charged battery. Indicator lamps 180 show the state of charge of a battery 320, see FIG. 4.

A lift truck is represented by a drawing 190, above which are several lamps; namely, height zone indicator lamps C1–C4, which indicate the height to which the forks 80 of the lift truck 10 are recommended to be raised for a given actual load on the forks 80, and fork height lamps H1–H4 and 80H, which represent the actual height of the forks 80. Also on the panel 170 are an operator correctable error indicator 192 (an ISO standard symbol), a maintenance needed indicator 194, a performance tune pushbutton 196, a truck hour usage pushbutton 198 represented by a stylized hourglass symbol, a maintenance pushbutton 200, a text display screen 210, and three pushbuttons 215, 220 and 225 for controlling input of data using the text display screen 210.

In accordance with the invention of the present application, diagnosing faults within a materials handling vehicle is performed using a system referred to as the "Access 1-2-3", which is a trademark of Crown Equipment Corporation, diagnosis system which is a total diagnostic solution that makes diagnosing a fault or failure on a vehicle as easy as following three simple steps, e.g., 1-2-3. The approach is straight forward, with each step being of manageable size and with the steps being consistently followed for all faults to be diagnosed thereby eliminating uncertainty for the service technician and the resulting frustration. In this way, the Access 1-2-3 diagnosis system can be easily utilized, regardless of the level of skill of a service technician, to level the playing field, or more accurately, level the diagnosing field, for technicians.

Figure 4:
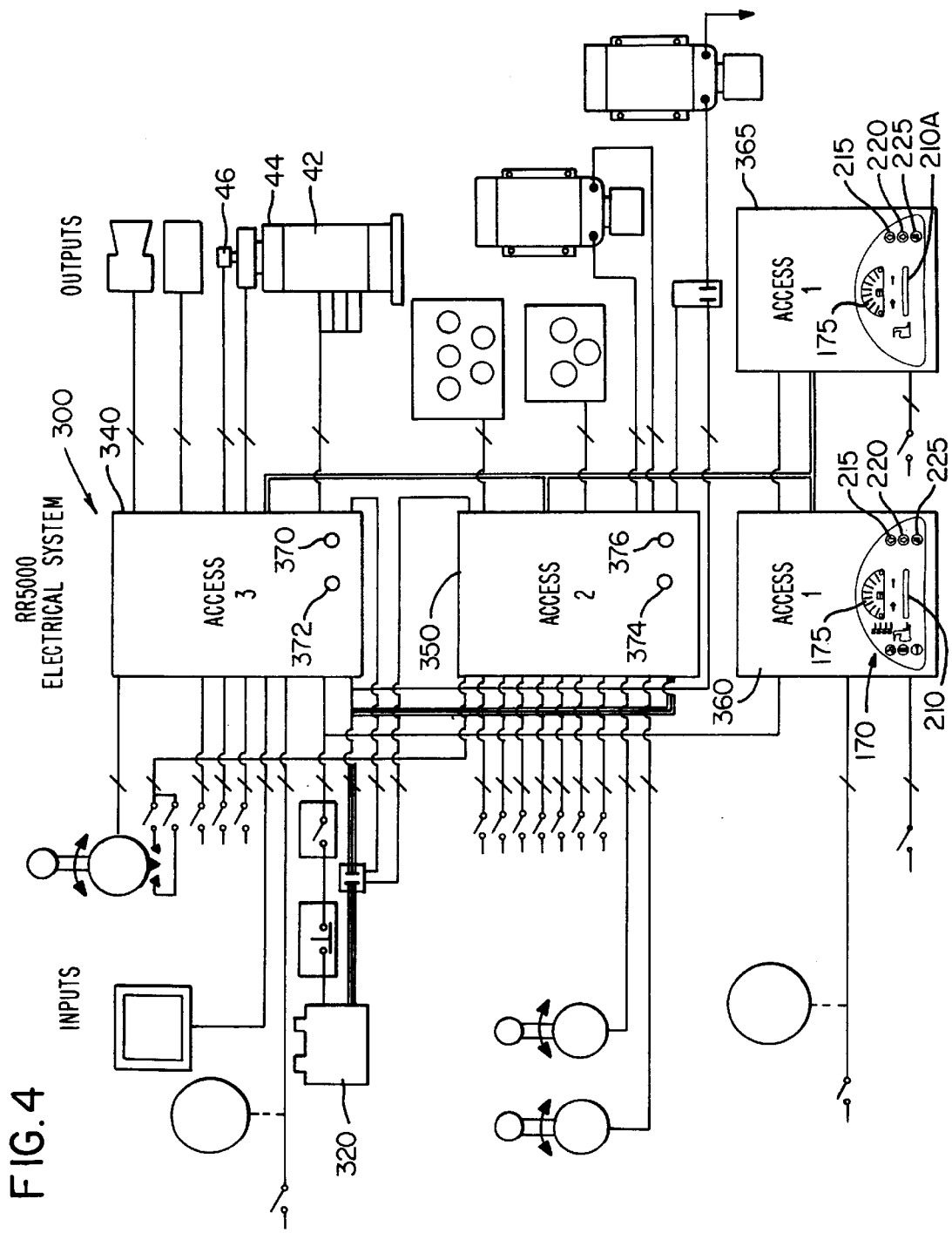
Figure 4A:
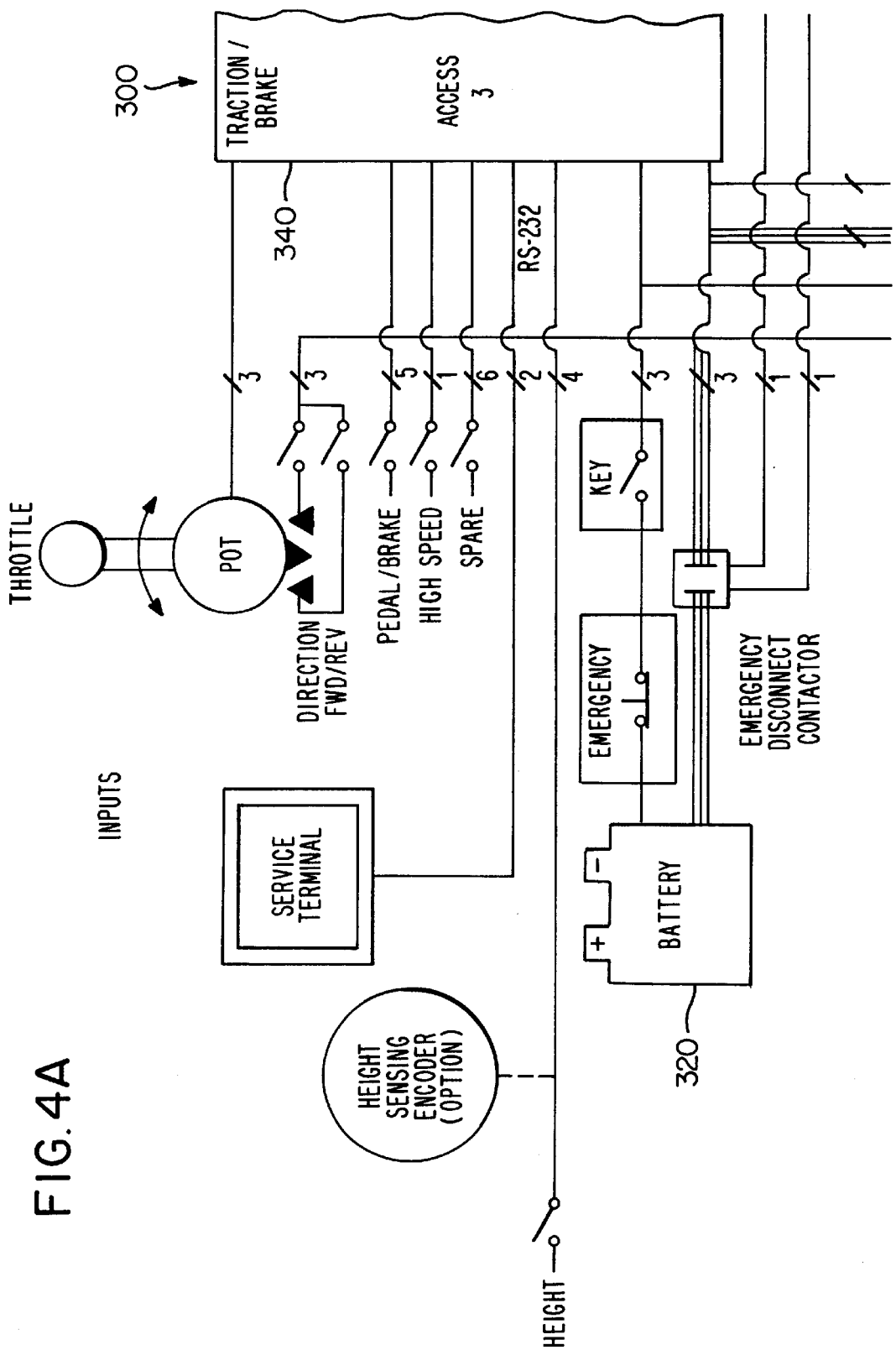
Figure 4B:
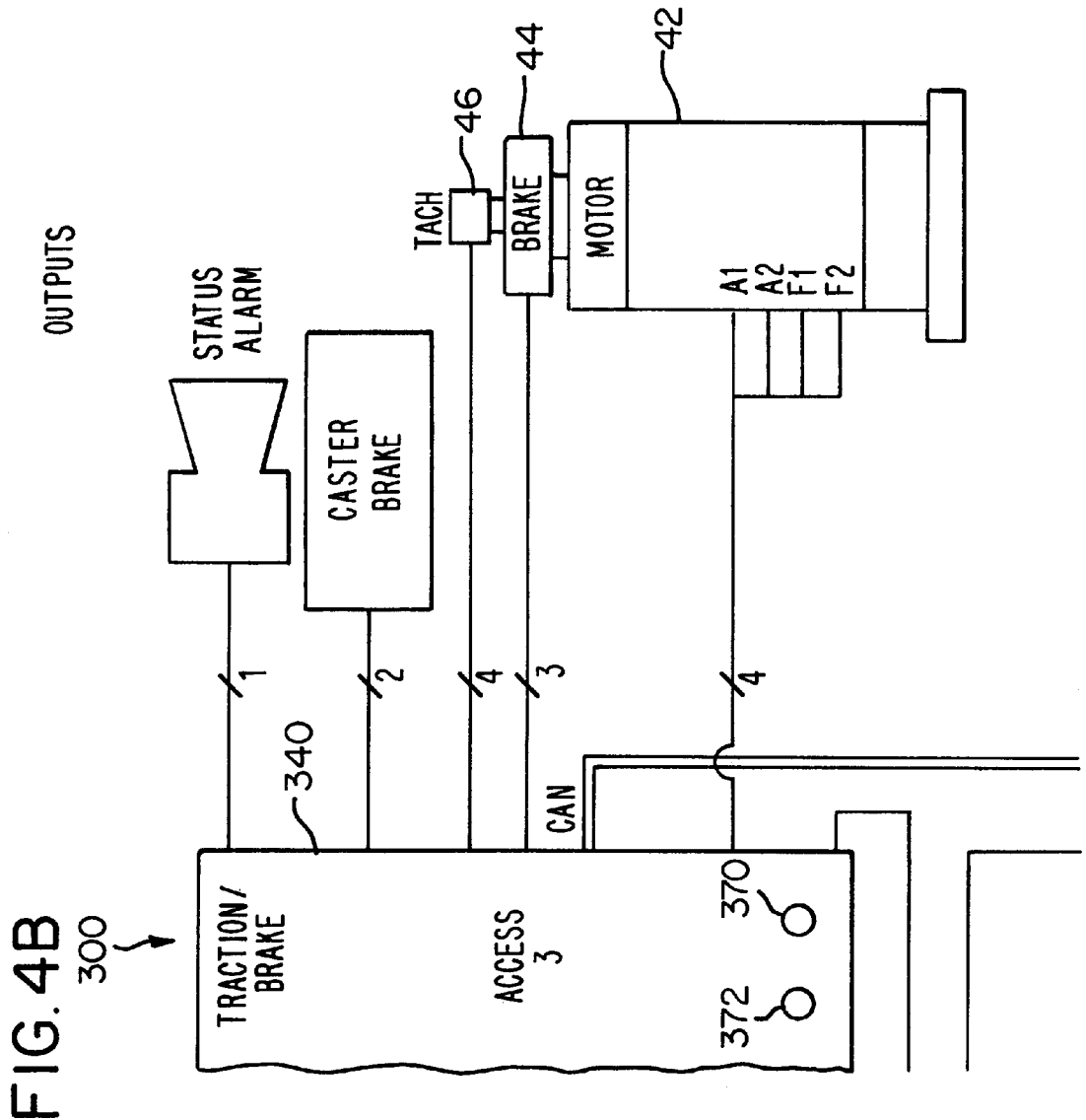

The Access 1-2-3 diagnosis system deals with an electronic control system 300 for the truck 10 as shown in FIG. 4, menus available on the text display screen 210, or a simplified text display screen 210A, and how information is presented to the service technician in a timely or on time informational approach to remove frustration from the diagnosis procedure. The Access 1-2-3 diagnosis system directs the service technician quickly to identify what circuit of a given system is involved and how to diagnose it.

The electronic control system 300 of FIG. 4 includes three modules, Access 3 module 340, Access 2 module 350 and Access 1 module 360, each of the modules 340, 350, 360 having a microprocessor therein. However, in the illustrated embodiment, the Access 3 module 340 is the primary control module and includes the software necessary and processing for the proper operation of the truck 10 while the Access 2 module 350 and the Access 1 module 360 serve primarily as intelligent I/O devices. Accordingly, the Access 2 module 350 is driven by the Access 3 module 340 during normal operation and during operation of the Access 1-2-3 diagnosis system of the present invention. Of course, other electronic control systems can include independent control modules which would operate autonomously when implementing the Access 1-2-3 diagnosis system. The voltage of the battery 320 is converted to digital form by an analog-to-digital converter in the Access 3 module 340 so that the microprocessor of the Access 3 module 340 knows the voltage level of the battery 320. Also, every major current consuming device in the truck 10 (except for pump motor P2) includes a current sensor which provides current consumption data to the microprocessor of the Access 3 module 340.

The Access 3 module 340 also includes I/O devices relating primarily to the traction and braking functions of the truck such that the Access 3 module 340 corresponds to traction/braking systems of the truck 10. The Access 2 module 350 includes I/O devices relating primarily to the hydraulic functions of the truck 10 such that the Access 2 module 350 corresponds to the hydraulic system of the truck 10. The Access 1 module 360 includes an enhanced display of I/O devices relating to the operator input and display functions of the truck 10 as described above relative to FIG. 3. Also shown in FIG. 4 is an Access 1 module 365 which includes a standard display with the standard display being an abbreviated version of the display 170 of FIG. 3. Either the Access 1 module 360 or the Access 1 module 365 would be used, but not both, on a single truck.

Figure 5:
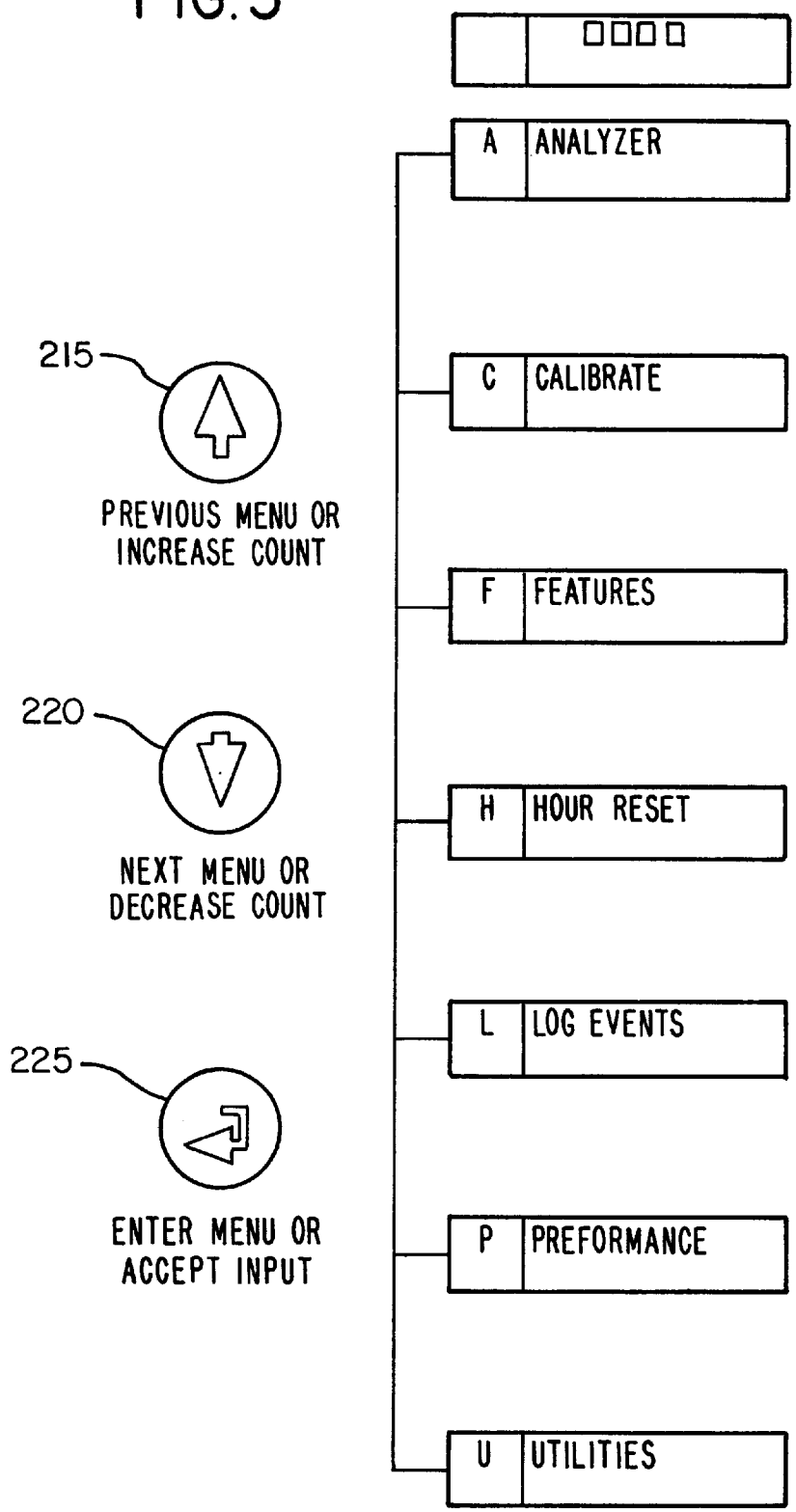
FIG. 5 is a diagram illustrating the second level menu entries of the operating modes for the diagnosis system of the present application.

In the standard display of the Access 1 module 365, simplifications include removal of a number of elements which are apparent by comparing the two displays in FIG. 4 or FIGS. 4C and 4D. In addition, the text display screen 210A is reduced from the full feature display screen 210 of the enhanced display to 4 seven-segment display elements. The seven-segment display elements can display a number of letters as well as all 4 digit numbers. Menus are used to control the Access 1-2-3 diagnostic system with the menus being designed so that they can be utilized on both the enhanced full feature display screen 210 and the standard display screen 210A. For example, the second level menu entries for the Access 1-2-3 diagnosis system shown in FIG. 5 are all represented by alphabetic characters which can be displayed on a seven-segment display: A—Analyzer Mode; C—Calibrate Mode; F—Features Mode; H—Hour Reset Mode; L—Log Events Mode; P—Performance Mode; and, U—Utilities Mode.

Service technicians for materials handling vehicles have different skill levels due to experience, training and innate abilities. Thus, the skill range of service technicians is from highly experienced technicians who can readily and systematically work their way through a problem to technicians with little or no experience who have more difficulty in solving diagnosis and repair problems. The goal of the Access 1-2-3 diagnosis system is to close the gap between these two extremes. That is, the Access 1-2-3 diagnosis system is designed to provide a consistent trouble shooting approach that substantially takes skill level out of the equation and produces a consistent approach to diagnosing problems.

To simplify the Access 1-2-3 diagnostic system, event codes, which identify faults which are detected in the truck 10, correspond to the modules of the electronic control system 300 of FIG. 4. Thus, any event code that starts with a 3, i.e., an event code in the 300 series of event codes, pertains to one or more components under the control of the Access 3 module 340; and, any event code that starts with a 2, i.e., an event code in the 200 series of event codes, pertains to the Access 2 module 350. There are no event codes which begin with a 1, i.e., in the 100's, since the Access 1 module 360 or 365 is substantially self contained and concerned primarily with displaying information relative to the operation of the truck 10.

Accordingly, when an event code is generated in response to a fault detected within the truck 10, the operator or service technician who is advised of the fault immediately knows the system of the truck 10 within which the fault occurred. That is, for event codes in the 200 series of codes, the fault is related to the Access 2 module 350 and hence to the hydraulic system of the truck 10. Similarly, for event codes in the 300 series of codes, the fault is related to the Access 3 module 340 and hence to the traction/braking system of the truck. Since the traction and braking are handled by the same module in the illustrated embodiment of the present invention, traction and braking are considered a single system. However, traction and braking could be separated and controlled by separate modules of the electronic control system, if desired, in which case the traction and braking systems would have codes in different hundred series which would corresponded to the two systems. Thus, for the service technician there is a simple tie-in of the event codes with the truck systems to be diagnosed and repaired. Such coordination facilitates and expedites repairs since when a service technician is told that a disabled truck was displaying a fault code of XXX, the technician immediately knows what tools and probable parts will be necessary for the repair, i.e., tools for repair of the hydraulic system for 200 series of event codes or tools for the repair of the traction/braking system for 300 series of event codes. The service technician can then assemble the appropriate tools before the technician even goes to the disabled truck.

There are three operating levels which involve the text display screens 210, 210A. In level 1 operation, the text display screens 210, 210A provide information to the operator for normal operation of the truck 10. Level 2 operation is reserved for the service technician and this level of operation is password protected. In level 2 operation, the service technician can operate the truck normally and can do everything the operator can do in level 1 operation; however, the service technician also can monitor inputs of interest to the electronic control system 300 and outputs of interest from the electronic control system 300 and can modify truck setups while in level 2 operation. To go into level 2 operation, the service technician holds down the previous menu, increase count or up arrow pushbutton 215 while keying on the truck 10 and then enters an acceptable password using pushbuttons 215, 220 and 225. Currently preferred passwords are 4 alphanumeric characters long with alphabetic characters being limited to those which can be accurately depicted on a seven-segment display.

Level 3 operation is even more reserved for the service technician and is also password protected. In level 3 operation, all of the normal operations of the truck 10 are disabled so that the truck 10 cannot be operated as in level 1 operation and level 2 operation. Rather than being able to operate the truck 10 as normal, in level 3 operation, the service technician is able to control the electronic control system 300 to generate outputs or output signals which result in full power activation of components of interest to be tested for a limited time period. Full power activation is limited to either the length of time the test is requested, such as by holding down the enter pushbutton 225, or to 2 seconds, whichever is less. In this way, full power tests are prevented from damaging properly functioning components yet allows the service technician to make an accurate evaluation which may not be possible if less than full power is applied.

This has been a problem in prior art testing where continuity or current trickle testing has been performed but may not result in an accurate test of a component. To go into level 3 operation, the service technician holds down both the previous menu, increase count or up arrow pushbutton 215 and the next menu, decrease count or down arrow pushbutton 220 while keying on the truck 10 and then enters an acceptable password using pushbuttons 215, 220 and 225.

When using the Access 1-2-3 diagnosis system, the first step is always to go to the text display screens 210, 210A of the display of the Access 1 module 360, 365 and get the event code which identifies a detected fault. If the detected fault is a hard fault, the event code will be reproduced by testing performed by keying on the truck 10. If the detected malfunction is not a hard fault such that an event code is not produced by keying on the truck 10, the service technician places the truck 10 into level 2 operation and attempts to repeat the fault by operating the truck 10 in a manner similar to that reportedly performed by the operator at the time the fault occurred which should result in recurrence of the fault and regeneration of the event code. Or, if the event code cannot be reproduced or diagnosis is to be undertaken without trying to reproduce the malfunction or event, a history section of the Log Events Mode—L—first level entry level of the menu is accessed and the last recorded event code is read from the log.

Once the event code has been regenerated or retrieved at the truck 10, the service technician accesses diagnostic information corresponding to possible faults within the truck 10. The event codes correspond to the possible faults so that entry into the diagnostic information using the event codes results in identification of a corresponding fault and identification of a portion of the truck 10 at which the fault occurred and identification of one or more components which caused the fault. The diagnostic information can be in the form of a hard copy, for example a printed reference guide, with one or two compact pages typically outlining the fault which corresponds to the event code. Alternately, the diagnostic information can be provided on-line, i.e., stored in a memory of a diagnostic system controller or computer, so that the operator would review the diagnostic information on a display screen such as the screen of a computer. If provided on-line, the information can be stored in a portable computer or a computer can be provide onboard the truck with a built in display or a portable display can be coupled to an onboard computer. Hard copy is currently preferred due to the added expense of having the diagnostic information on-line; however, as the costs of computers, displays and related equipment continue to fall, this may not be the case in the future.

In whatever form, the diagnostic information converts the event codes to hardware on the truck 10. Preferably, the diagnostic information provides schematic illustrations of the one or more components which caused the fault and identifies the portion of the truck 10 which includes the one or more components. Thus, the second step directs the service technician to the portion of the truck which contains the components which caused the fault and informs the technician generally, at least by schematic representation(s), how those components are interconnected. The service technician then goes to the identified portion of the truck 10.

Since technicians work on a number of pieces of equipment which can include a number of different materials handling vehicles, the technician probably will not be up to speed on the structural details of any given truck, particularly if the truck normally presents few problems. Under these circumstances and further to assist the technician, the second step of the Access 1-2-3 diagnosis system is to provide pictorial diagrams or pictograms which are placed at the various portions of the truck to which a technician is directed by the diagnostic information to clearly identify, by picture, component names and component designations, the location, arrangement and interconnections of the components at that portion of the truck 10, see FIGS. 7–11. To further expedite and prepare the service technician for the diagnosis/repair task at hand, preferably, the pictograms are also included with the diagnostic information so that the technician has already started the familiarization process before even moving to the indicated portion of the truck. In the preferred embodiment of the invention, the identified portions are closed so that the technician must remove a cover to reveal the pictograms.

By providing pictorial depictions of portions of the truck 10 at the corresponding locations, the service technician is able to go back and forth between viewing the actual truck portion and the pictogram which pictorially portrays it. The technician can then quickly locate and identify components and connections within the truck with confirmation of component appearances, component designations, key connection points, where connections terminate, and the like. The pictograms provide the technician with the ability to immediately verify identifications of components, connections, etc. adding to accuracy of diagnosis, reducing diagnosis time and greatly adding to the confidence of the technician.

Thus, the service technician is able quickly to locate the components which are identified as having caused the fault with the aid of the diagnostic information and the pictogram within the diagnostic information and/or at the identified location of the truck where the fault occurred. The service technician then tests or diagnoses the components, using the Access 1-2-3 diagnosis system, to determine what component is faulty and needs to be replaced to correct the fault thus completing the third step of the diagnostics procedure.

Each of these straight forward steps provides just the information that is required by the technician as the technician needs it, i.e., the information is provided on-time. In this way, frustration and a sense of being overwhelmed are substantially eliminated. Thus, the service technician determines from the event code what the fault is, what portion of the truck is involved and what components are involved without having to apply previous information or leafing through a massive service manual. The technician then goes to the indicated portion of the truck 10, removing any associated cover if necessary, and reviews the pictogram which pictorially depicts that portion of the truck 100 and the suspected components. The Access 1-2-3 diagnostic system is then used to diagnose the components.

Currently in the industry, when a microprocessor based control system encounters a problem, the microprocessor shuts itself off to protect against any further damage to the microprocessor. But, in shutting down the microprocessor, the technician is unable to use the microprocessor to probe the remainder of the truck to diagnose the problem. Contrary to existing systems, in the Access 1-2-3 diagnostic system, the microprocessor can be used to monitor inputs to and outputs from the microprocessor and generate full power, but time limited, control signals for diagnosing components implicated in a fault by a corresponding event code. In this way, rather than replacing components to see whether they are at fault, the components can be diagnosed and verified to be properly operational or at fault such that only faulty components are replaced.

Another important aspect of the Access 1-2-3 diagnosis system is that faults are diagnosed from the ends of the control paths back toward the controllers, i.e., Access 2 module 350 and Access 3 module 340, or from the outside to the inside. To this end and to simplify the circuitry and testing as much as possible, most control paths go from one of the modules 340, 350 through a signal conducting path to a component which is to respond to the control signal. Thus, for outside/inside testing, the component is first tested or diagnosed and, if okay, the conducting path is tested and, if okay, the controlling module is suspect. This is the exact opposite of what normally happens with swaptronics where the control element is commonly replaced first to ensure that control signals are being properly generated.

Also, since a large majority of faults are due to failed components being controlled or the circuitry interconnecting those components to the control modules, most faults or faulty components are found and repaired before control modules are placed in suspicion. In this way, potentially more time consuming, wasteful and unnecessary replacement of properly functioning control modules which might otherwise be made are avoided. Thus, what the Access 1-2-3 diagnosis system does is enable the service technician to quickly get to the right component and clearly determine whether that component is faulty or good.

With this basic understanding of the Access 1-2-3 diagnosis system, more detailed data input and output using the three pushbuttons 215, 220 and 225, and one of the text display screens 210, 210A will now be described to illustrate fault diagnosis and correction. In particular, operating levels 2 and 3 as used by the service technician will now be described with reference to the analyzer mode of the seven layers of the service menu shown in FIG. 5 which is used for the diagnosis process.

The analyzer mode is split into four sections: status; inputs; outputs; and test outputs. For example, using section two of the analyzer mode, inputs, the service technician is able to look at substantially every input to the electronic system 300, whether it is a switch, a potentiometer, an encoder, a pressure transducer, or whatever. When operating at operating level 2, the service technician is able to operate the truck 10 normally while being able to monitor whatever inputs are of interest as being suspect in causing a fault being diagnosed.

Movement through and within the service menu is performed using the three pushbuttons: the up arrow pushbutton 215; the down arrow pushbutton 220; and, the enter pushbutton 225. The enter pushbutton 225 moves further into a layer in any given menu level, accesses the selected menu item or moves out of the level if pushed when in an escape entry. Once in a given menu level, the up and down arrow pushbuttons 215, 220 navigate through a series of different options. For instance, when in the A Analyzer mode or level, the up arrow pushbutton 215 will lead to the Utilities level (since the menus wrap), the down arrow pushbutton 220 will lead to the Calibrate level and the enter key 225 will lead further into the Analyzer level to the A1 Status level, see FIG. 6. In the A1 Status level, the up arrow pushbutton 215 will lead to the A5 Escape level [which returns to the A Analyzer level if the enter pushbutton 225 is pushed], the down arrow pushbutton 220 will lead to the A2 Inputs level and the enter pushbutton 225 leads to the A1.1 Steer level. Once in a level in the menu, such as the A1.1 Steer level, the up arrow and the down arrow pushbuttons 215, 220 enable scrolling through each of the entries in that level.

As a further example, if a service technician wants to monitor a particular input, from the Analyzer level, the enter pushbutton 225 is pushed and the down arrow pushbutton 220 is pushed to arrive at the A2 Inputs level. The enter pushbutton 225 is then pushed and the up arrow/down arrow pushbuttons 215, 220 are used to scroll through the 36 inputs which can be monitored in the embodiment illustrated in FIG. 6. Once the input that is of interest has been selected, pressing the enter pushbutton 225 updates the display with that input information.

The Access 1-2-3 diagnosis system of the present invention can maintain a history of operation of at least some of the monitored inputs and display that history on either one of the display screens 210, 210A. The ability to store and display input histories is particularly important with regard to switch inputs. For example, if a switch is located so that the text display 210, 210A can not be seen when the switch is being manually controlled, normally two technicians would be required to test the switch. Now a single technician can monitor the switch since its operating history is stored and displayed. With each transition being recorded on the display, up to a selected limit such as 4, if the technician is up on the mast, he or she can toggle a switch, then go back down to the display and see that each state actually was recorded (or not if the switch is defective) by reviewing the switch history on the display 210, 210A.

It is noted that for the text display screen 210A that, since only 4 characters can be displayed at a time, the input being displayed is alternated with the value of that input. For example, if a switch input is being monitored, the last up to 4 states of the switch can be displayed with 0 being used to represent an open switch state and 1 being used to represent a closed switch state. Thus, for A2.1 which represents the input from the forward switch (FS), being monitored, the display would alternately display "A2.1" and the last up to 4 switch states, for example "0101". With potentiometers and encoders, the technician can first note the reading for the device, go to the device, move its control element and then go back to the display and see that the reading actually changed as it should have. This is possible since, basically, whatever input is monitored maintains its present value except for switches for which a history of their operation states is maintained within limits, up to four switch transitions for the illustrated embodiment. It is noted, however, that in a working embodiment of the invention, a history of three transitions is used and has proved to be adequate for the invention. Of course, the history of the operation of switches could be more than four if desired with either a larger display being used or the total switch history being alternately displayed on the display.

Navigation is the same whether the standard display 210A or the enhanced display 210 is used. For example, if you are in the Analyzer Mode, all the menus start with a character A for analyzer along with a digit 1 through N; that refers to a given layer inside that mode of the display. For instance, on the enhanced display it would say "A2.1 FS =," but on the standard display it would just say "A2.1"; so the same navigating tool is used for both of the displays. The enhanced display gives more textual information. Once the entry is selected by pushing the enter pushbutton 225, the information in that portion of the display is over-written with the current value of the selected entry. For the enhanced display 210, the "A2.1 FS=" remains, but the display also contains the actual status of the selected input. But using the standard display, the displayed information would alternate back and forth between "A2.1" and the history of the forward switch, for example, "0101." In a working embodiment of the invention, after 3 transitions of the switch, the display is cleared and the present status of the switch is again displayed in position 1, i.e., the rightmost display position, with transitions of the switch being placed in positions 2 and 3. Thus, the display can be observed as the history is being saved.

Under the A3 Outputs level, the technician can monitor all the outputs from the electronic control system 300 as they are being sent out to the hardware components. In level two operation, the technician can operate the truck in a normal mode, driving around, lifting, lowering, etc. and observe the commands that the electronic control system 300 is sending out to the various solenoids, relays, and other components as requested by the operator moving the control handle 110, one of the pedals 150, 155, or any other output generating component of the truck.

Figure 6:
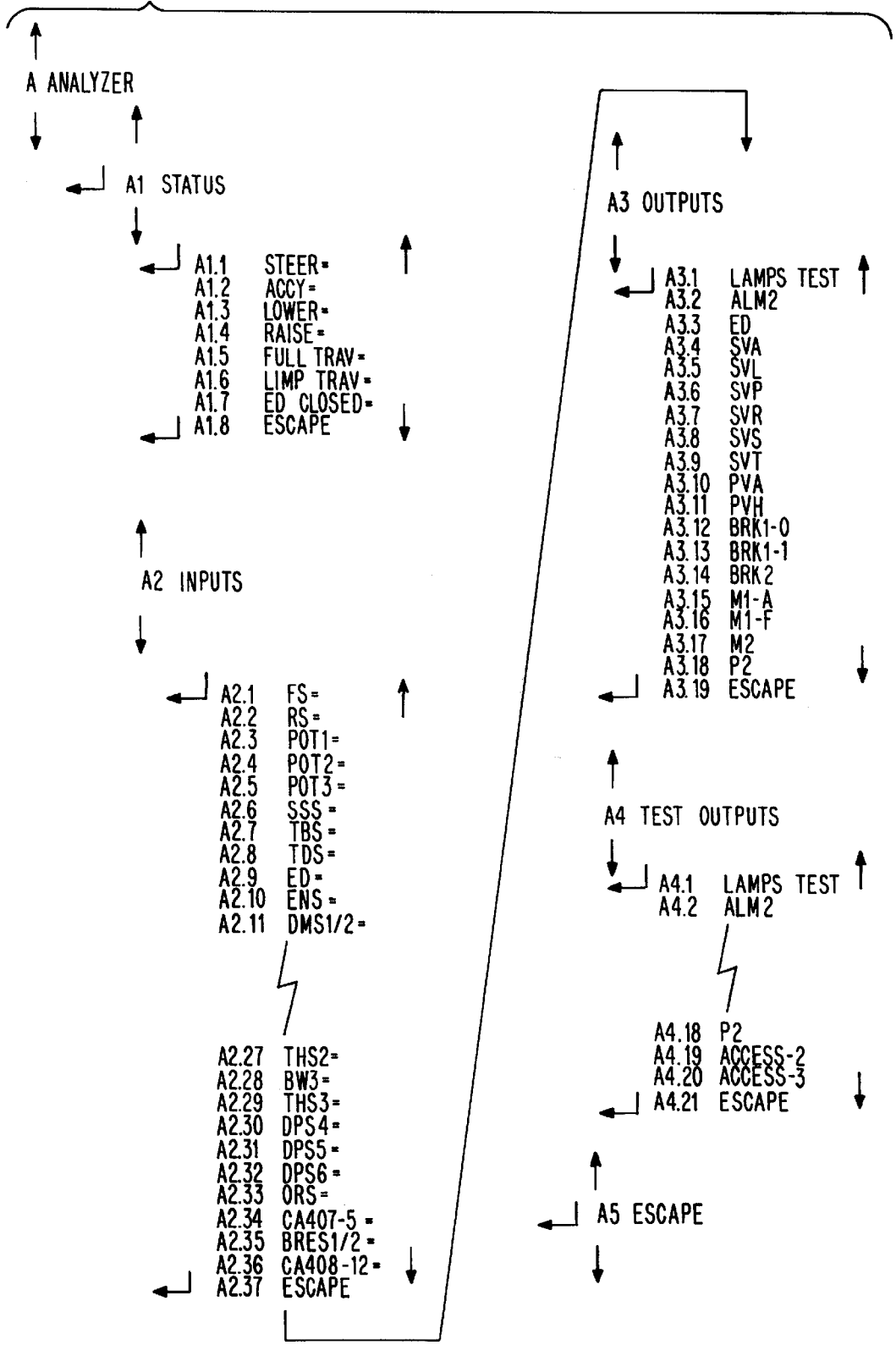
FIG. 6 illustrates the second and third level menu entries for the analyzer mode of operation of the seven layers of the service menu shown in FIG. 5.
Figure 7:
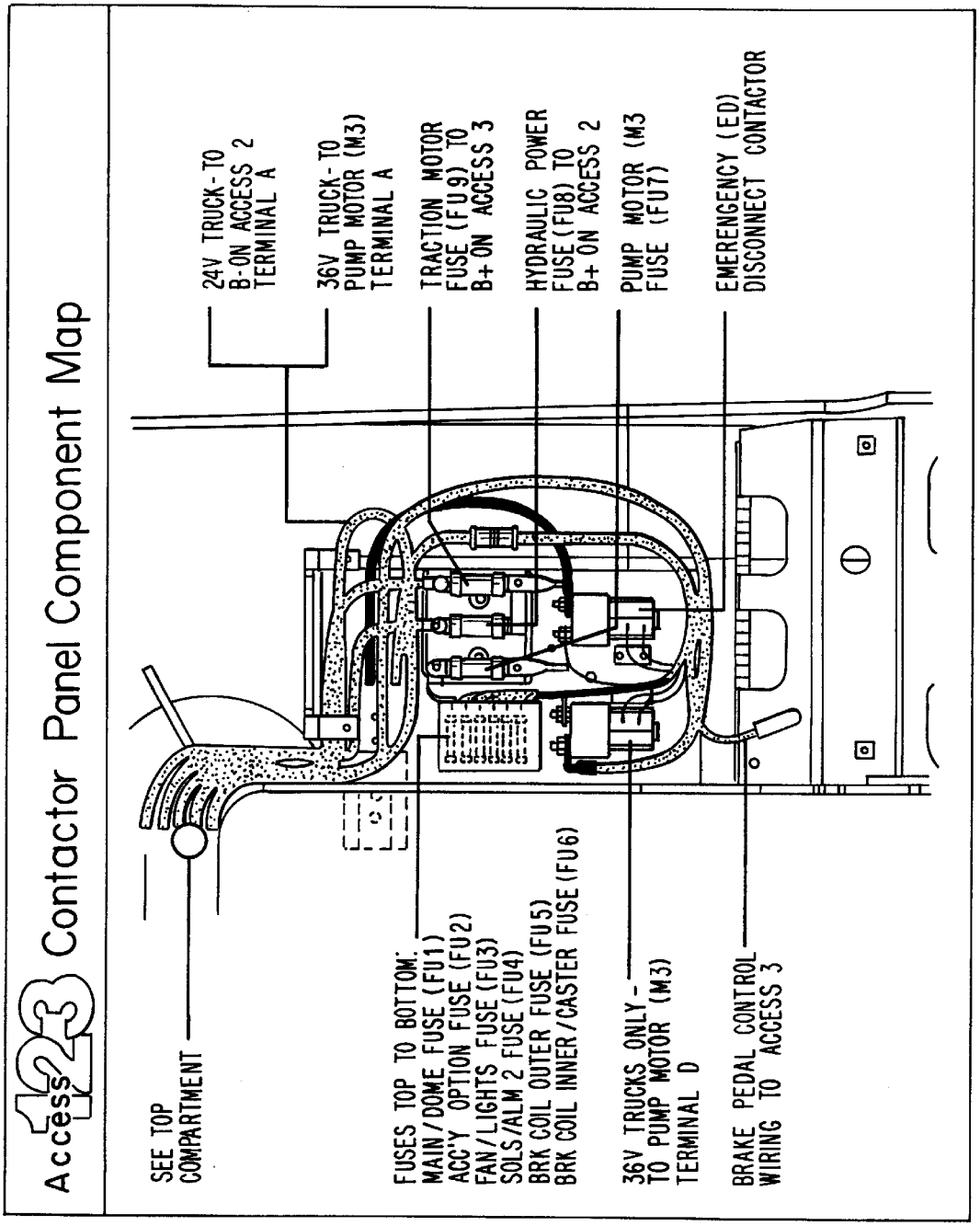
FIG. 7 is a pictogram of a contactor panel component and wiring map for use in the present invention.
Figure 8:
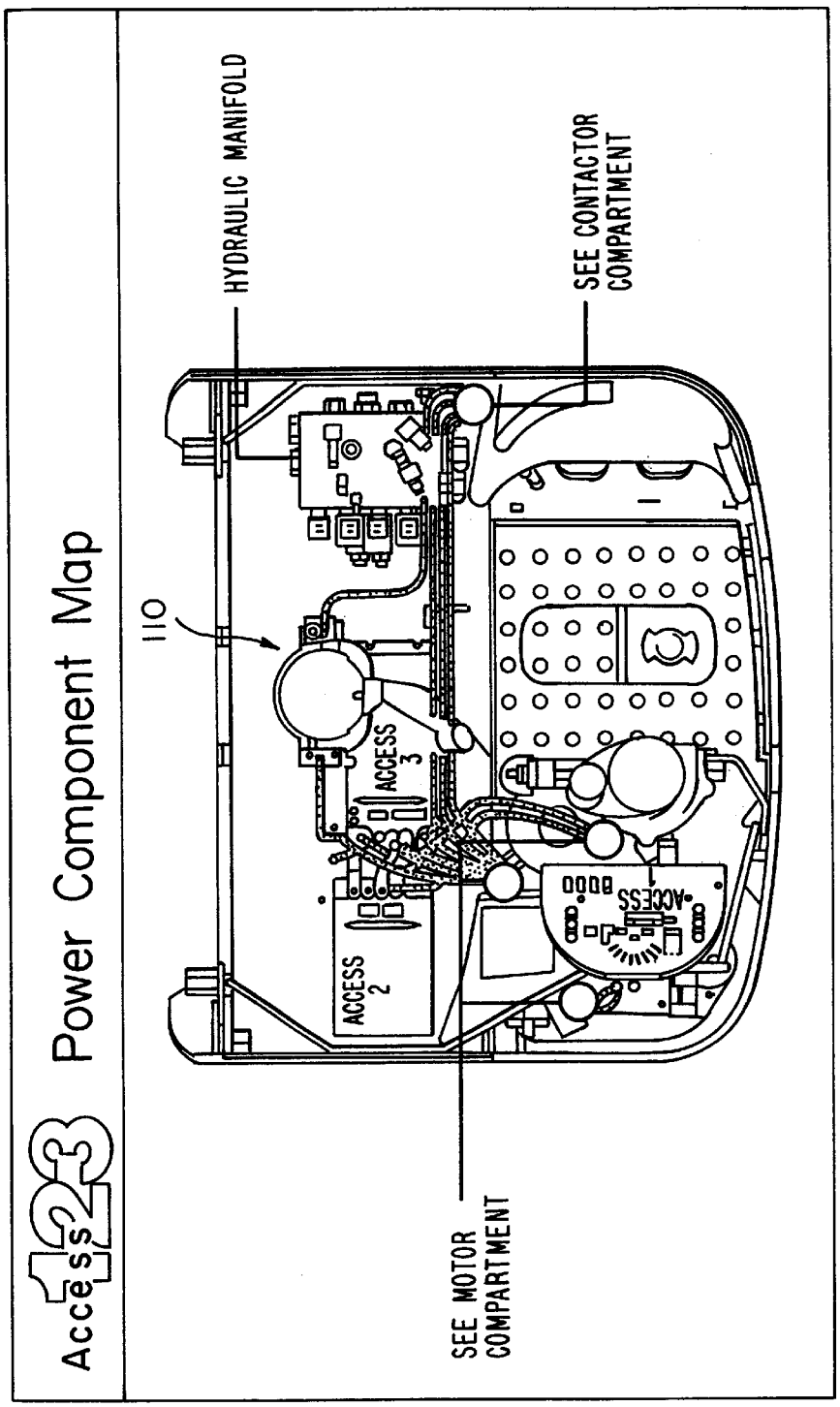
FIG. 8 is a pictogram of a power component and wiring map for use in the present invention.
Figure 9:
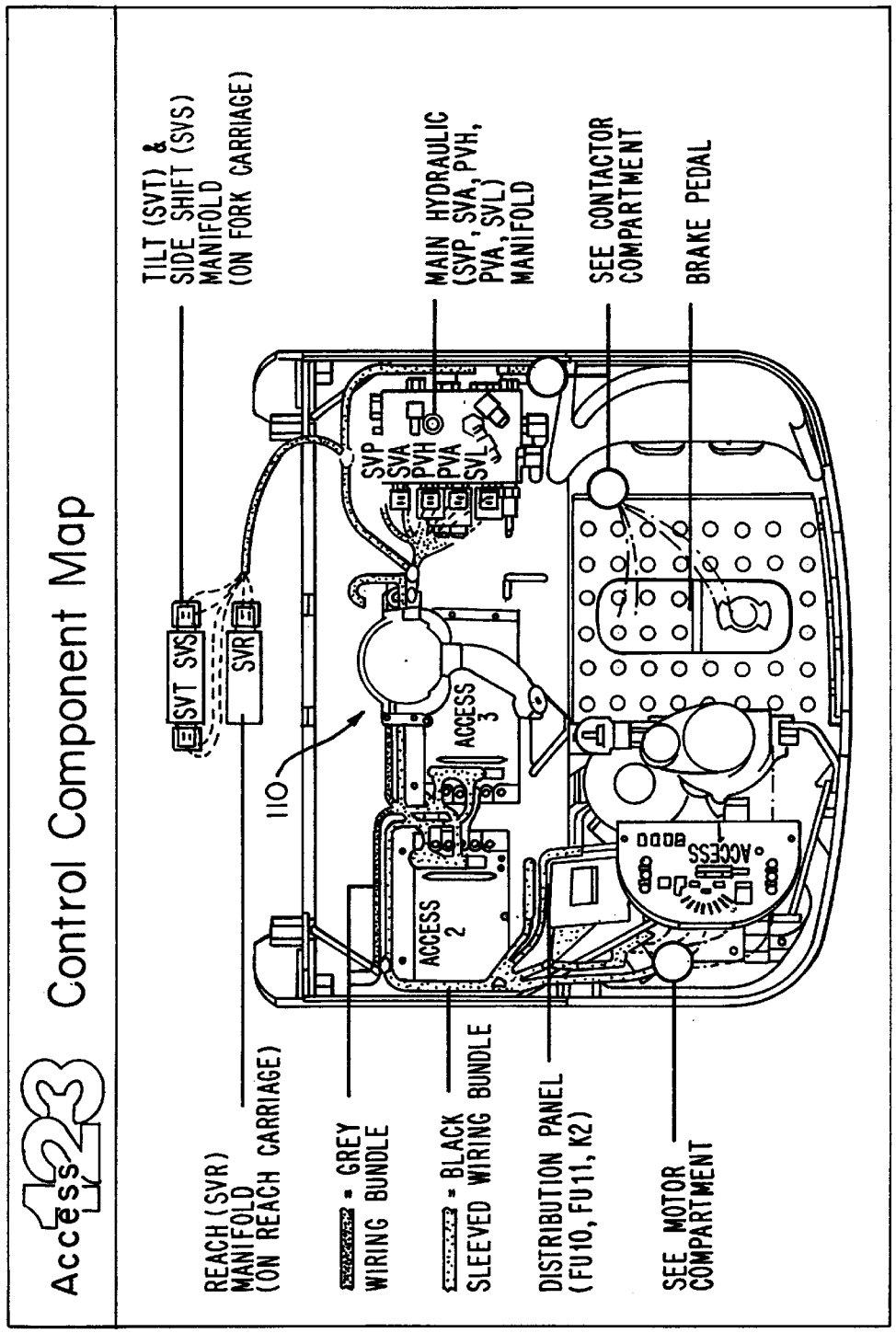
FIG. 9 is a pictogram of a control component and wiring map for use in the invention of the present application.
Figure 10:
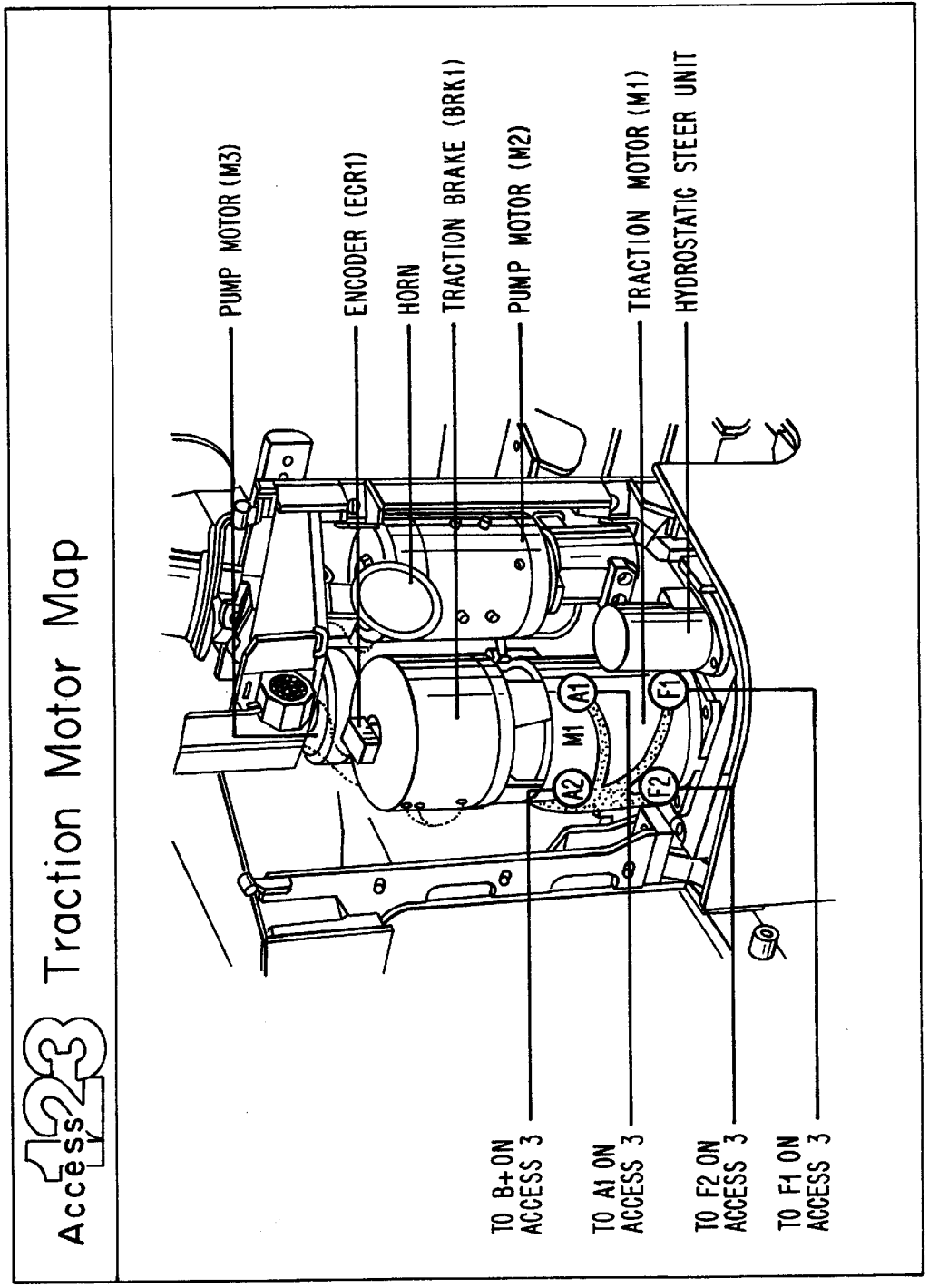
FIG. 10 is a pictogram of a traction motor map for use in the present invention.
Figure 11:
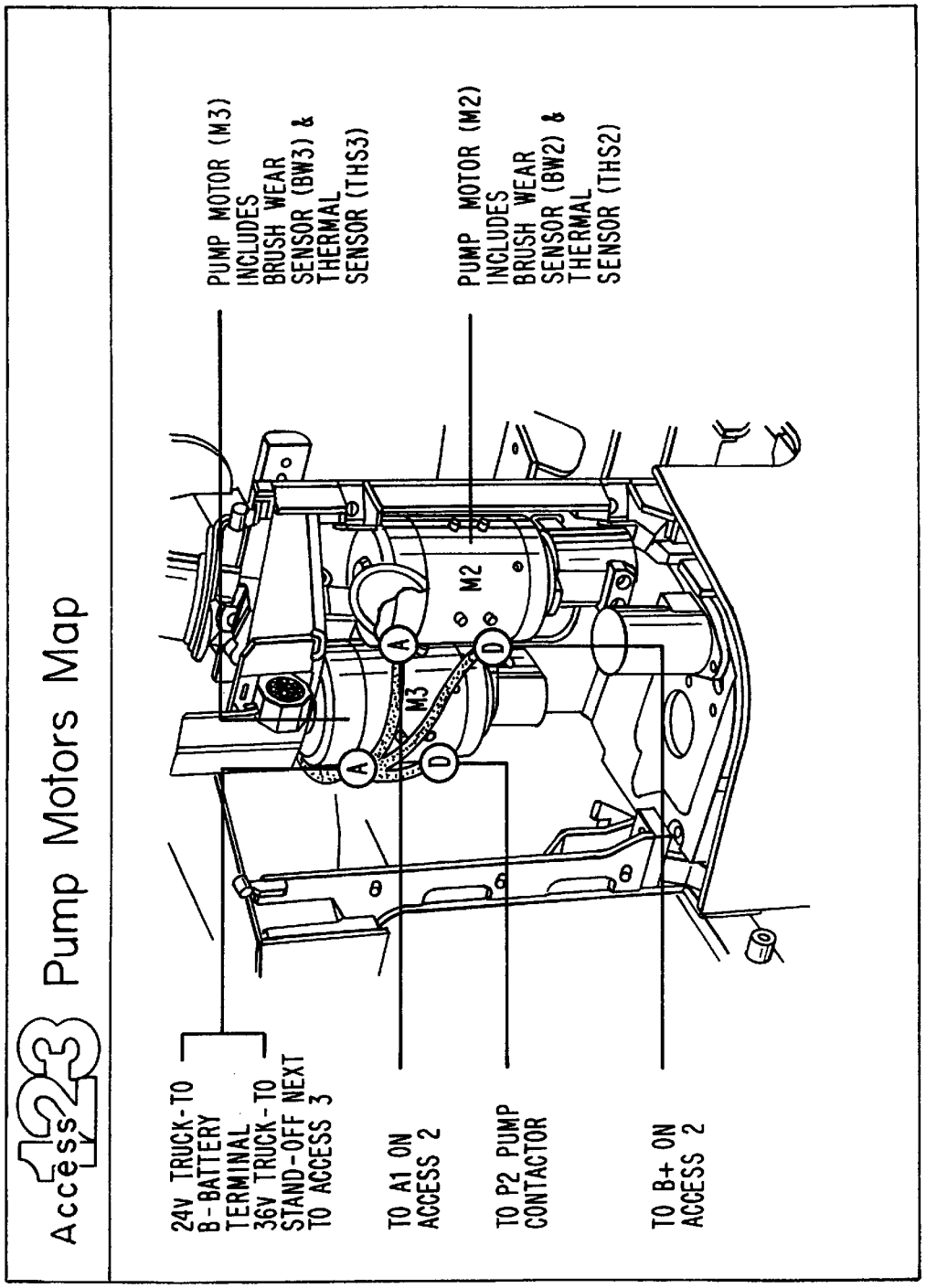
FIG. 11 is a pictogram of a pump motors map for use in the present invention.

Under level 3 operation which provides the Test Output Mode, see A4 Test Outputs in FIG. 6, the truck 10 can no longer be operated in a normal fashion since all the operating systems have been disabled or bypassed. In the level 3 mode of operation, the service technician is no longer operating the truck 10 but is limited to turning on outputs from the electronic control system 300 for a limited period of time, i.e., for as long as an output is requested or 2 seconds, whichever is less. Thus, an outputs can be turned on for 2 seconds or for as long as the technician holds down the enter key 225, whichever is less. The 2 second on-time is long enough to get a meter reading, but not so long that damage can be done to any of the hardware in the event of a failure in or closely related to the component being tested.

It is noted that the way the menu structure is set up, the enter key 225, which takes you from menu level A4 Test Outputs into menu level A 4.n, will not start an output test if pushed once again. Rather, when you are in menu level A 4.n you then must use the up arrow pushbutton 215 and/or the down arrow pushbutton 220 to select which output is to be driven. Only after an output to be tested has been selected using the up arrow pushbutton 215 and/or the down arrow pushbutton 220 can the entry key can be pressed to test the output. Thus, when the entry key is released, or 2 seconds have elapsed, the same test is not performed again if the entry key is pressed. Instead, you revert back to A4 Test Outputs level, which forces section of another output. This is done so that a service technician does not accidentally hit the entry pushbutton 225 multiple times in succession without intending to since repeated full power tests, even of limited time duration, could lead to damage in the circuitry being tested if faults exist. With the chosen menu structure, the worst that would happen if a technician hits the enter key multiple times at the test output layer, the test would toggle between the main menu level and turning on the lamps.

As previously mentioned, the importance to the test outputs function in the Access 1-2-3 diagnosis system is that the tests are being performed under full power conditions rather than with a trickle current/voltage as is commonly used for continuity testing. Unfortunately, continuity tests create inconclusive results since a system or component may be appear to be working and have full connectivity under such low level testing, but prove to be faulty under high current or full power testing. This is particularly true for current feedback problems and some kinds of intermittent failure modes.

Thus, on the traction motor 42, the armature and the field can be driven independently so that no travel or motion of the truck is produced, but 300 amps can be sent to the armature to test it and either a positive or negative 40 amps can be sent to the field to test it in both directions but no travel or motion of the truck is produced. Likewise, solenoids can be driven at full current with the resulting voltage measurements being used to determine whether connecting wires have an open or a short or whether a solenoid coil has an internal failure or whether it is operating properly under full power. Again, the full power testing is to enable a service technician to determine what component or components are truly bad and need to be replaced.

The event codes are normally displayed to an operator or service technician through the text display 210, 210A. However, in the event the display 210, 210A is not functioning, the event code for a fault within the truck 10 can still be retrieved from the Access 3 module 340 through operation of a light source 370 which is provided on the Access 3 module 340. The light source 370 is accompanied by a power on light 372 which is illuminated if power is on to the Access 3 module 340. The light source 370 is controlled to blink out the digits of event codes with consecutive digits of the event codes being separated by a first dark period of the light source. A second dark period of the light source serves as a initialization signal so that an operator or technician can properly interpret the blinking of the light source 370. For example, 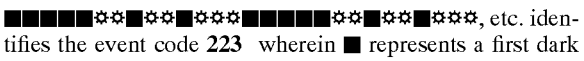, etc. identifies the event code 223 wherein ■ represents a first dark period of the light source 370, ✿ represents a blink or short illuminated period of the light source 370 and ■■■■■ represents the second dark period of the light source or initialization signal.

In a working embodiment of the present invention, the blinking of the light source 370 provides additional information relative to the Access 3 module 340. In particular, if the code pertains to one of the event codes described above including the 200 series of event codes and the 300 series of event codes, i.e., a run time event, the blinked event code is preceded by a run time event signal, for example, a blink of one. Accordingly, for this arrangement, the event code 223 would appear as 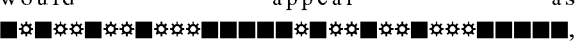, etc. where ■■■■■ represents the second dark period of the light source or initialization signal. If a problem is encountered when booting up the microprocessor of the Access 3 module 340, a code is then blinked out indicating that a boot error has occurred and identifying a particular one of a number of possible boot errors to facilitate repair of the Access 3 module 340 once it is replaced.

The Access 2 module 350 also has two light sources 374, 376. The light source 374 is illuminated if power is on to the Access 2 module 350 and the light source 376 is illuminated only if the Access 2 module 350 has an internal fault.

While the foregoing description fully sets forth the structure and operation of the Access 1-2-3 diagnosis system of the present invention, a brief example of operation of the system to diagnose and correct a detected fault will now be made as a summary. The fault which will be described is in a potentiometer which controls the raising and lowering of the forks 80 and is linked to the control handle 110. The presumed fault is a detected overvoltage on the high side of the raise/lower potentiometer POT2 which can be monitored as an input to the electronic control system 300 under the A Analyzer mode of operation of the Access 1-2-3 diagnosis system under the A2 Inputs level and is specifically identified as A2.4 in FIG. 6. This fault is identified as event code 245 which is displayed on the text display 210, 210A. In the event the text display 210, 210A is not working, the event code can be obtained from the Access 3 module 340 by observing the blinking of the light source. The event code 245 would appear as ■✸■✸✸■✸✸✸✸■✸✸✸✸■■■■■■✸■✸✸■✸✸✸✸■✸ ✸✸✸✸■✸✸✸✸✸■■■■■, etc.

When an overvoltage on the high side of POT2 is detected, the event code 245 is generated and displayed. For this particular fault, operation of the truck 10 at full travel speed is disabled and the raise/lower operation of the forks is also disabled. Since the truck 10 can still limp to a service area, the operator would move the truck 10 to that area rather than leave the truck where the fault occurred. Of course, if the detected fault resulted in disabling the ability to move the truck, the truck must be left where the movement disabling fault occurred.

The service technician immediately knows that the problem is in the hydraulic system and involves the Access 2 module 350 since the event code begins with a "2" and, accordingly, the technician also knows what tools and probable parts will be required to repair the fault. The service technician next goes to the diagnosis information, for example in a hard copy of a quick reference guide, and looks up the event code 245. An example of the diagnosis information for an event or status code is illustrated by the diagnosis information for event code 245 shown in FIG. 12. POT2 is a part of the control handle 110 and the terminals CA611-5, CA611-6 and CA611-7 are clearly marked on the control handle 110 as are the terminals CA405-15, CA405-16 and CA405-8 on the Access 2 module 350.

Following the instructions, the input A2.4 is monitored using the Access 1-2-3 diagnosis system by entering level 2 operation by pushing the up arrow pushbutton 215 while keying on the truck 10. Once in level 2 operation, the high side of POT2 is selected by selecting the input A2.4 to be monitored. While an external voltmeter can be used, the Access 1-2-3 diagnosis system is configured to read out the voltage level directly on the display 210, 210A so that the a voltage level is displayed. If the voltage level is approximately 5 volts, the raise/lower potentiometer POT2 is bad and must be replaced. The remainder of the diagnosis information indicates what the voltage levels are for the center, full up and full down positions of the control handle 110. If correct readings are confirmed, an intermittent connection is likely in the raise/lower potentiometer POT2 so that connections and the potentiometer should be checked. Finally, the raise/lower potentiometer must be adjusted and calibrated to return the truck 10 to service.

Having thus described the invention of the present application in detail and by reference to preferred embodiments thereof, it will be apparent that modifications and variations are possible without departing from the scope of the invention defined in the appended claims.

What is claimed is:

1. A method for diagnosing faults within a materials handling vehicle by providing information on time to a repair person, said method comprising the steps of:

providing diagnostic information for a plurality of possible faults within said vehicle, said plurality of possible faults being identified by a corresponding plurality of event codes with each of said plurality of event codes being within one of at least two series of event codes, each series of event codes identifying a system of said vehicle to enable a repair person to prepare for diagnosis of faults within an identified system corresponding to an event code's series;

locating pictorial depictions of portions of said vehicle on corresponding portions of said vehicle to facilitate location and identification of components at said portions of said vehicle by reference to said pictorial depictions;

detecting a fault within a materials handling vehicle;

generating one event code of said plurality of event codes representative of said detected fault;

accessing said diagnostic information using said one event code, said diagnostic information identifying a portion of said vehicle within which said detected fault occurred and identifying one or more components at said portion of said vehicle capable of causing said detected fault thereby directing said repair person to said portion of said vehicle and said one or more components;

accessing a pictorial depiction of said portion of said vehicle within which said fault has been detected, said pictorial depiction being located at said portion of said vehicle for ready access by said repair person to facilitate location and identification of said one or more components; and diagnosing said one or more components utilizing said diagnostic information.

2. A method for diagnosing faults within a materials handling vehicle as claimed in claim 1 wherein said step of providing diagnostic information for a plurality of possible faults within said vehicle comprises the step of providing said diagnostic information as a hard copy.

3. A method for diagnosing faults within a materials handling vehicle as claimed in claim 1 wherein said step of providing diagnostic information for a plurality of possible faults within said vehicle comprises the step of providing said diagnostic information on line.

4. A method for diagnosing faults within a materials handling vehicle as claimed in claim 1 wherein said portions of said vehicle are closed and said step of locating pictorial depictions of portions of said vehicle on corresponding portions of said vehicle comprises locating said pictorial depictions within said closed portions of said vehicle.

5. A method for diagnosing faults within a materials handling vehicle as claimed in claim 1 wherein said portion of said vehicle within which said detected fault occurred is under the control of a single module of an electronic control system of said vehicle and said step of diagnosing said one or more components utilizing said diagnostic information comprises the steps of:

monitoring inputs to said single module; and monitoring outputs from said single module.

6. A method for diagnosing faults within a materials handling vehicle as claimed in claim 5 further comprising the step of displaying monitored inputs and outputs.

7. A method for diagnosing faults within a materials handling vehicle as claimed in claim 6 further comprising the step of saving a history of operation of at least some of said monitored inputs and wherein said step of displaying monitored inputs and outputs comprises the step of displaying said history.

8. A method for diagnosing faults within a materials handling vehicle as claimed in claim 7 wherein said step of saving a history of at least some of said inputs comprises the step of saving inputs generated by switches within said vehicle.

9. A method for diagnosing faults within a materials handling vehicle as claimed in claim 8 wherein said step of saving inputs generated by switches within said vehicle comprises saving at least the last three inputs generated by said switches.

10. A method for diagnosing faults within a materials handling vehicle as claimed in claim 5 wherein said step of diagnosing said one or more components utilizing said diagnostic information further comprises the steps of generating outputs from said single module.

11. A method for diagnosing faults within a materials handling vehicle as claimed in claim 10 wherein said step of generating outputs from said single module comprises the step of generating full power outputs from said single module.

12. A method for diagnosing faults within a materials handling vehicle as claimed in claim 11 wherein said step of generating outputs from said module comprises the step of limiting the time duration of said full power outputs from said single module.

13. A method for diagnosing faults within a materials handling vehicle as claimed in claim 12 wherein said step of limiting the time duration of said full power outputs from said single module comprises the step of limiting said full power outputs to 2 seconds or as long as a test is requested, whichever is shorter.

14. A method for diagnosing faults within a materials handling vehicle as claimed in claim 1 further comprising the step of displaying said one event code of said plurality of event codes representative of said detected fault.

15. A method for diagnosing faults within a materials handling vehicle as claimed in claim 14 wherein said step of displaying said one event code of said plurality of event codes representative of said detected fault comprises the step of displaying said one event code on an alphanumeric display.

16. A method for diagnosing faults within a materials handling vehicle as claimed in claim 14 wherein said step of displaying said one event code of said plurality of event codes representative of said detected fault comprises the step of displaying said one event code with a blinking light source.

17. A method for diagnosing faults within a materials handling vehicle as claimed in claim 16 wherein said one event code is a numeric having at least two digits and said step of displaying said one event code with a blinking light source comprises the steps of:

providing an initialization signal; and blinking each digit of said event code in seriatim, each digit of said one event code being separated from another digit of said event code by a first dark period of said light source.

18. A method for diagnosing faults within a materials handling vehicle as claimed in claim 17 wherein said initialization signal comprises a second dark period of said light source.

19. A method for diagnosing faults within a materials handling vehicle as claimed in claim 16 wherein one event code is a numeric having at least two digits and said step of displaying said one event code with a blinking light source comprises the steps of:

providing an initialization signal;

blinking a run time event signal; and blinking each digit of said event code in seriatim, each digit of said event code being separated from another digit of said event code and from said run time event signal by a dark period of said light source.

20. A method for diagnosing faults within a materials handling vehicle as claimed in claim 1 wherein said portion of said vehicle within which said detected fault occurred is under the control of a single module of an electronic control system of said vehicle and said step of diagnosing said one or more components utilizing said diagnostic information comprises the step of first testing said one or more components and circuitry external to said single module.

21. A method for diagnosing faults within a materials handling vehicle as claimed in claim 1 wherein said portion of said vehicle within which said detected fault occurred is under the control of a single module of a multiple module electronic control system of said vehicle and said step of diagnosing said one or more components utilizing said diagnostic information comprises the step of generating outputs from said single module.

22. A method for diagnosing faults within a materials handling vehicle as claimed in claim 21 wherein said multiple module control system comprises at least a primary control module and said single module, and said step of generating outputs from said single module comprises the step of driving said single module from said primary control module.

* * * * *